United States Patent [19]

Hwang

[11] Patent Number: 5,441,570
[45] Date of Patent: Aug. 15, 1995

[54] APPARATUS FOR LOW PRESSURE CHEMICAL VAPOR DEPOSITION

[75] Inventor: Chul-Ju Hwang, Kyungki-Do, Rep. of Korea

[73] Assignee: Jein Technics Co., Ltd., Rep. of Korea

[21] Appl. No.: 263,930

[22] Filed: Jun. 21, 1994

[30] Foreign Application Priority Data

Jun. 22, 1993 [KR] Rep. of Korea ............... 11063/1993
Jan. 27, 1994 [KR] Rep. of Korea ............... 1546/1994
Jun. 14, 1994 [KR] Rep. of Korea ............... 13732/1994

[51] Int. Cl.$^6$ ............................................. C23C 16/00
[52] U.S. Cl. .................... 118/725; 118/715; 118/729
[58] Field of Search .................... 118/715, 725, 729

[56] References Cited

U.S. PATENT DOCUMENTS

| | | | |
|---|---|---|---|
| 4,640,223 | 2/1987 | Dozier | 118/725 |
| 5,076,206 | 12/1991 | Bailey | 118/725 |
| 5,116,784 | 5/1992 | Ushikawa | 118/715 |

Primary Examiner—Richard Bueker
Attorney, Agent, or Firm—Leydig Voit & Mayer

[57] ABSTRACT

Apparatus for low pressure chemical vapor deposition. The LPCVD apparatus of this invention has a compound source gas flow path which is formed between the inside and outside quartz tubes of the reactor. With the path, the apparatus supplies the compound source gas from the upper section to the lower section of the reactor and lets the source gas be introduced into the deposition reacting space of the reactor while being sufficiently mixed and sufficiently heated and achieves the desired deposition result of uniform quality and thickness of chemical thin layers. The LPCVD apparatus also prevents introduction of oxygen into the reactor when washing the quartz tubes of reactor using $N_2$ gas, thus to prevent forming of undesirable oxide on the wafers and to minimize the fraction defective of result wafers. In LPCVD apparatus of this invention, the inside and outside quartz tubes of the reactor are easily separated and assembled with respect to the apparatus housing, thus to be easily washed or substituted with new tubes and to be produced in mass production with lower cost.

21 Claims, 17 Drawing Sheets

APPARATUS FOR LOW PRESSURE CHEMICAL VAPOR DEPOSITION

BACKGROUND OF THE INVENTION

2. Field of the Invention

The present invention relates in general to apparatus for low pressure chemical vapor deposition (LPCVD)and, more particularly, to an improved structure in such LPCVD apparatus for depositing excellent quality of compound thin layers on wafers and for achieving the desired high integration degree of the semiconductor devices.

2. Description of the Prior Art

As well known to those skilled in the art, the low pressure chemical vapor deposition (LPCVD) technique has been wide used for deposition of insulating layers, dielectric layers, conductive layers and the like in production of semiconductor devices.

In the typical LPCVD, compound source gases such as $SiH_4$, $Si_2H_6$, TEOS, $PH_3$, $NH_3$, $N_2O$, TMOB, TMOP, $O_2$ and $N_2$ are thermally decomposed by heating them in vacuum and, thereafter, deposited on the wafers.

However, the above compound source gases are different in their thermal decomposition temperatures from each other so that there is a problem in management for retaining the optimal condition of vapor deposition in accordance with temperatures. Furthermore, since the vapor deposition temperatures of the compound thin layers are very high so that there is generated thermal shock between the thin layers deposited on the wafers and this changes the physical performances of the wafers and deteriorates the electric performances of the wafers. In this regard, several problems are caused in high integration and mass production of the semiconductor devices.

In the typical LPCVD, the compositions of compound thin layers deposited on the wafers are different from each other in accordance with locations of the wafers in the reactor. Therefore, several problems may be caused in the vapor deposition process as well as in the continued processes in production of semiconductor devices.

Another problem of the typical LPCVD is resided in that it may cause environmental contamination in its chemical reaction since the desired condition of chemical reaction is scarcely achieved.

Hereinbelow, construction and operation of typical LPCVD apparatus will be described in conjunction with the accompanying drawings, FIGS. 15 and 16.

FIG. 15 shows in a sectional view an example of typical LPCVD apparatus and FIG. 16 shows the LPCVD apparatus of FIG. 15 from which the boat is separated. As shown in these drawings, the LPCVD apparatus comprises a deposition base 1 which has a compound source gas inlet 1a and a reaction product outlet 1b. The inlet 1a and the outlet 1b extend from opposed side walls of the base 1. The apparatus further includes a reactor 2 of the double tube structure comprising an inside quartz tube 2a and an outside quartz tube 2b. The outside quartz tube 2b is airtightly coupled to the above deposition base 1 while the inside quartz tube 2a is placed in the outside tube 2b and defines a deposition reacting space S therein. The deposition reacting space S communicates with the compound source gas inlet 1a. There is provided a reaction product discharge path 2c between the inside and outside quartz tubes 2a and 2b and communicates with the reaction product outlet 1b of the deposition base 1. The bottom opening of the deposition base 1 is closed by a closing plate 3. A boat 4 is placed on the closing plate 3 and supports a plurality of wafers W thereon. The double structure reactor 2 is surrounded by reactor heating means 5. This heating means 5 is adapted for heating the reactor 2.

In the drawings, the reference numeral 1c denotes an annular support inwardly extending from an inner surface of the base 1, the numeral 6 denotes a deposition apparatus housing, the numeral 7 denotes a fixing bolt for fixing the deposition base 1 to the housing 6 and the numeral 8 denotes a lifting ram for lifting the boat 4. The boat lifting ram 8 is provided with a boat support 8a on its top end.

In deposition of chemical thin layers on the wafers W using the above LPCVD apparatus, the boat 4 is separated from the apparatus so as to seat the wafers W on the boat 4. After seating the wafers W on the boat 4, the boat 4 is inserted into the deposition reacting space S of the reactor 2 by operation of the boat lifting ram 8 as shown in FIG. 15. At the same time of insertion of the boat 4 with the wafers W, the closing plate 3 closes the bottom opening of the base 1. Thereafter, the compound source gas is introduced into the deposition reacting space S of the reactor 2 through the compound source gas inlet 1a of the base 1 while maintaining, using a vacuum equipment (not shown) and the heating means 5, both degree of vacuum and temperature of the space S suitable for vapor deposition process.

The compound source gas introduced into the lower section of the reactor 2 is in turn flows upward through the lower section of the inside quartz tube 2a. During the upward flowing of the source gas in the reactor 2, the gas is thermally decomposed and deposition-reacted so that the compound thin layers are deposited on the wafers W respectively.

At this time, the reaction products of the above chemical thin layer depositing reaction are exhausted to the outside of the apparatus through the discharge path 2c, defined between the inside and outside tubes 2a and 2b of the reactor 2, and the outlets 1b of the base 1 owing to the absorption force of the vacuum equipment (not shown).

However in the above typical LPCVD apparatus, the cool compound source gas is directly introduced into the lower section of the inside quartz tube 2a of the reactor 2 so that the thin layer depositing reaction of the cool gas at about the wafers W placed at the lower section of the reactor 2 is carried out even though the gas is not sufficiently heated and activated. This causes unstable deposition of the thin layers such as resulting in uneven doping effect. In addition, both the thickness and the composition of the thin layers deposited on the wafers W are not uniform in accordance with the positions of the wafers W.

The compound source gas is lifted through the inside tube 2a of the reactor 2 and, thereafter, flows at the upper section of the reactor 2 through the discharge path 2c formed between the inside and outside tubes 2a and 2b. In this regard, the heat of the heating means 5 is first transferred to the discharged compound source gas and, thereafter, transferred to the inlet compound source gas, so that the heating effect of the heating means 5 is deteriorated. In addition, the thin layers are deposited on the wafers W as well as on the inside and outside tubes 2a and 2b of the reactor 2. The repeated deposition of thin layers on the inside and outside tubes 2a and 2b shields the radiant heat of the heating means 5, so that the heating effect of the heating means 5 becomes worse. Therefore, the reactor 2 having the inside and outside quartz tubes 2a and 2b wastes large amount of power due to deterioration of the heating efficiency of the heating means 5 and is difficult to control the temperature. Another problem of the above typical reactor 2 is resided in that it causes somewhat difficulty in management of the inside and outside quartz tubes 2a and 2b.

Meanwhile when a native oxide is formed on each wafer, the chemical and physical characteristics of the chemical thin layers of the wafers W are changed so that it should be required to prevent forming of the above native oxide on the wafers so as to achieve the deposition of excellent chemical thin layers on the wafers W.

In order to achieve the above object, oxygen or an oxidant is removed and the boat 4 is moved with respect to the reactor 2 under the condition of inert atmosphere or conventional $N_2$ atmosphere.

However in the typical apparatus, the $N_2$ gas or the inert gas is introduced from the lower section of the inside tube 2a to the upper section of the tube 2a under the condition that the bottom of reactor 2 is opened by lowering the closing plate 3 and the boat 4 with the wafers W is removed from the reactor 2. During the above introduction of the $N_2$ gas, there is generated an upward air current and, in this regard, the oxygen or the oxidant is introduced into the reactor 2 along with the upward air current. The oxygen introduced into the reactor 2 and the high inside temperature of the reactor 2 form the oxide on the wafers W during upward movement of the boat 4 with the wafers W toward the depositing position of the reactor 2, thus to deteriorate the characteristics of the chemical thin layers of the wafers W.

As described above, the chemical thin layers are deposited on the wafers W as well as on the inside and outside quartz tubes 2a and 2b of the reactor 2 during the thin typical layer deposition. With the thin layer deposition on the quartz tubes 2a and 2b, the tubes 2a and 2b needs separating from the base 1 and washing so as to remove the deposited material or needs substituting with new tubes.

However in the typical apparatus, the base 1 is fixed to the housing 6 by the fixing bolts 7 and the quartz tubes 2a and 2b are simply laid on the base 1 so that the separation and assembling of the quartz tubes 2a and 2b with respect to the base 1 are attended with waste of much time. Furthermore, the separation and assembling of the tubes 2a and 2b is a burdensome work.

SUMMARY OF THE INVENTION

It is, therefore, an object of the present invention to provide apparatus for low pressure chemical vapor deposition in which the aforementioned problems can be overcome and a compound source gas flow path is formed between the inside and outside quartz tubes of the reactor thus to supply the compound source gas from the upper section to the lower section of the reactor and to let the source gas be introduced into the deposition reacting space of the reactor while being sufficiently mixed and sufficiently heated and to achieve the desired deposition result of uniform quality and thickness of chemical thin layers.

It is another object of the present invention to provide apparatus for low pressure chemical vapor deposition which prevents introduction of oxygen into the reactor when washing the quartz tubes of reactor using $N_2$ gas, thus to prevent forming of undesirable oxide on the wafers and to minimize the fraction defective of result wafers.

It is still another object of the present invention to provide apparatus for low pressure chemical vapor deposition in which the inside and outside quartz tubes of the reactor are easily separated and assembled with respect to the apparatus housing, thus to be easily washed or substituted with new tubes and to be produced in mass production with lower cost.

In order to accomplish the above objects, apparatus for low pressure chemical vapor deposition in accordance with a preferred embodiment of the present invention comprises: a deposition base having a compound source gas inlet and a reaction product outlet at opposed sides thereof; a reactor airtightly coupled to a top end of the deposition base at its bottom end; a closing plate provided on the bottom of the deposition base for selectively closing a bottom opening of the deposition base; a boat lifting ram movably penetrating a center opening of the closing plate, the ram being provided with a boat support on its top end; a boat seated on the boat support of the ram and supporting a plurality of wafers thereon; means for introducing a compound source gas to a top section of the reactor and ejecting the source gas at that top section of the reactor, the gas introducing means being connected to the compound source gas inlet of the base at its bottom end and positioned about a top section of the boat at its top end; and heating means for heating the reactor, the heating means surrounding the reactor.

BRIEF DESCRIPTION OF THE DRAWINGS

The above and other objects, features and other advantages of the present invention will be more clearly understood from the following detailed description taken in conjunction with the accompanying drawings, in which:

FIGS. 1 and 2 are sectional views of LPCVD apparatus in accordance with a primary embodiment of the present invention respectively, in which:

FIG. 1 shows the LPCVD apparatus in a vapor deposition process; and

FIG. 2 shows the LPCVD apparatus of FIG. 1 free from a boat;

FIGS. 10 to 12E show LPCVD apparatus in accordance with a sixth embodiment of the present invention, in which:

FIG. 10 is a sectional view of the LPCVD apparatus;

FIG. 11 shows the LPCVD apparatus of FIG. 10 free from a boat; and

FIGS. 12A to 12E are sectional views of the LPCVD apparatus of FIG. 10, showing the operation of the apparatus;

DESCRIPTION OF THE PREFERRED EMBODIMENTS

Figure 1:
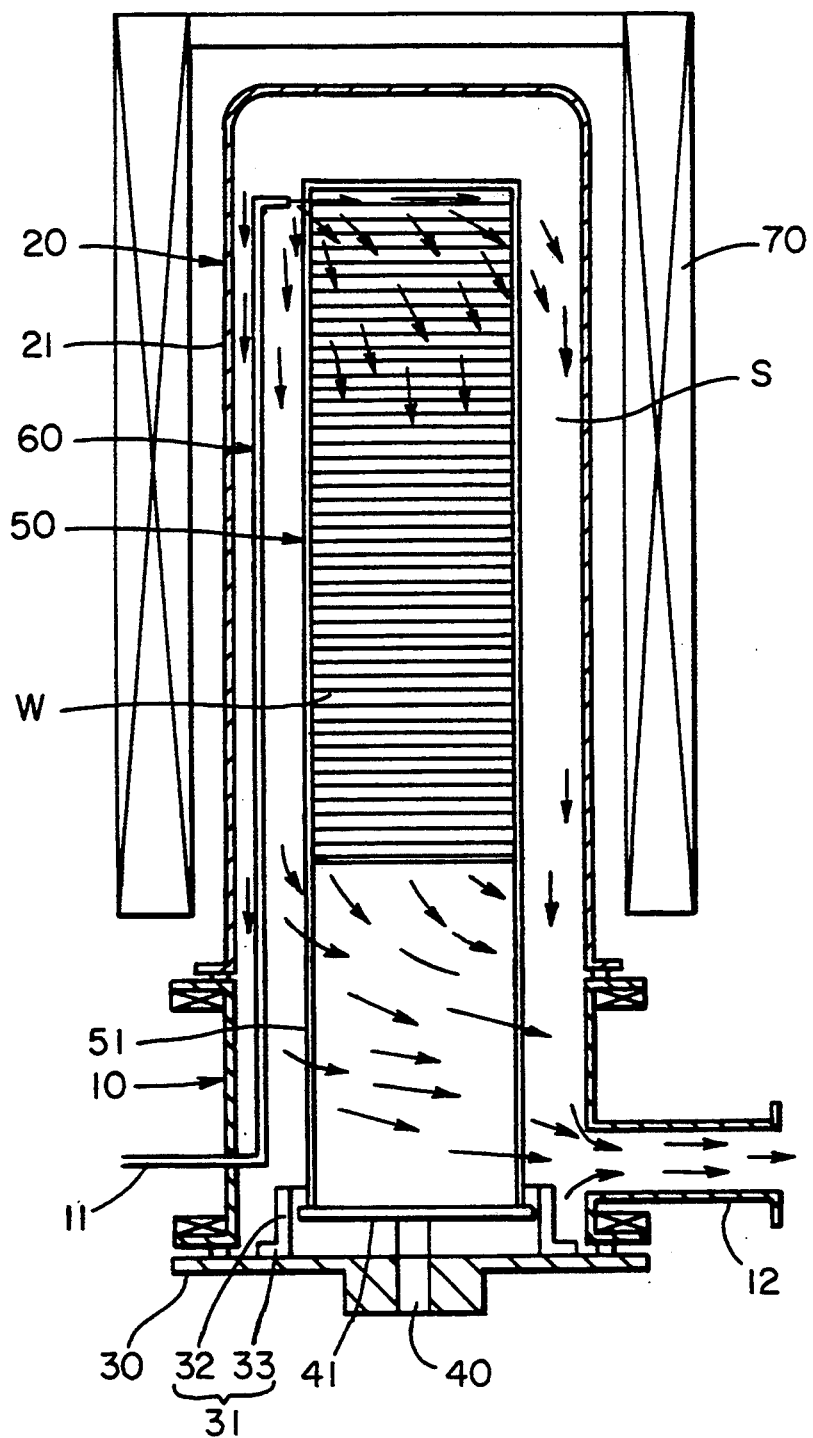
Figure 2:
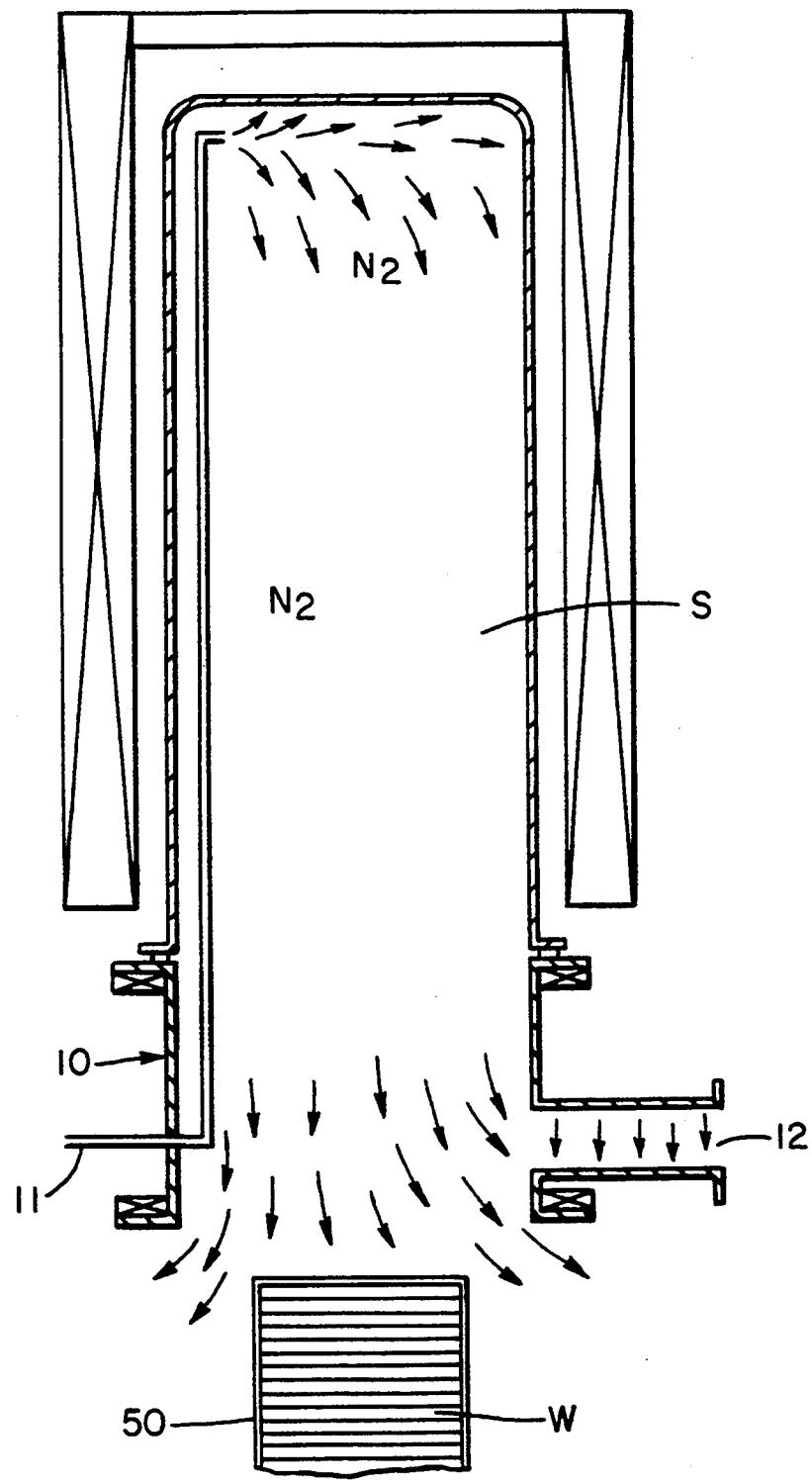

With reference to FIGS. 1 and 2, there is shown apparatus for low pressure chemical vapor deposition (hereinbelow, referred to simply as "the LPCVD apparatus") in accordance with a primary embodiment of the present invention. In the drawings, FIG. 1 shows the LPCVD apparatus in a vapor deposition process and FIG. 2 shows the LPCVD apparatus free from a boat.

As shown in the above drawings, the LPCVD apparatus comprises a deposition base 10 which has a compound source gas inlet 11 and a reaction product outlet 12. The inlet 1a and the outlet 1b are provided at opposed sides of the base 10. The reactor 20 of this LPCVD apparatus comprises a quartz tube 21 airtightly coupled to the top end of the above deposition base 10 at its bottom end. The bottom opening of the deposition base 10 is closed by a closing plate 30. A ram 40 is lifted through a center opening of the closing plate 30 and is provided with a boat support 41 on its top end. The boat support 41 supports a boat 50 thereon. The boat 50 is seated on the boat support 41 of the ram 40 and supports a plurality of wafers W thereon. A compound source gas inlet pipe 60 is coupled to the gas inlet 11 at its bottom end and positioned about the top section of the boat 50 at its top end. The reactor 20 is surrounded by reactor heating means 70. This heating means 5 is adapted for heating the reactor 2.

The deposition base 10 is detachably mounted on a housing (not shown). With the detachable mounting of the base 10 on the housing, the quartz tube 21 of the reactor 20 is separated as demanded.

The quartz tube 21 of the reactor 20 is a cylindrical tube in which the top is closed but the bottom is opened and the diameter is uniform lengthwise.

The closing plate 30 selectively closes the bottom opening of the base 10 when loading or unloading the boat 50 with the wafers W in the reactor 20. In order to prevent possible deposition of thin layer on the top surface of the closing plate 30, the top surface of the plate 30 is provided with a deposition preventing ring 31 surrounding the boat support 41 of the ram 40.

The deposition preventing ring 31 comprises a cylindrical body 32 surrounding the boat support 41 of the ram 40 and a flange 33 closely contacting with the top surface of the closing plate 30.

The ram 40 is lifted by a rectilinear reciprocating mechanism (not shown).

In the boat 50, support shoulders for supporting the wafer edges are formed on a plurality of columns or on three columns so as to support the plurality of wafers or about 100 wafers thereon while spacing out them at regular intervals. A boat support member 51 is coupled to the bottom of the boat 50 for achieving smooth discharge of the reaction product.

The compound source gas inlet pipe 60, which is coupled to the compound source gas inlet 11 of the base 10 at its bottom end, is fixed to the inner surface of the base 10 and extends upward to the top section of the reactor 20 such that its top end is positioned about the top section of the loaded boat 50. With the pipe 60 whose outlet is placed about the top section of the loaded boat 50, the compound source gas introduced through the inlet 11 of the base 10 is ejected at the top section of the deposition reacting space S in the reactor 20.

The gas inlet pipe 60 is made of quartz and preferably coupled to the inlet 11 of the base 10 through a conventional pipe joint.

The heating means 70 is preferably selected from conventional heat transferring heaters. This heating means 70 is such placed that its top is higher than the top of the quartz tube 21 of the reactor 20 but its bottom is leveled with the lowermost wafer W seated on the loaded boat 50.

In a chemical thin layer deposition on the wafers W by the above LPCVD apparatus, the boat 50 with the plurality of wafers W are first inserted into the deposition reacting space S of the reactor 20. After the insertion of the boat 50 into the reactor 20, the bottom of the base 10 is closed by the closing plate 30, thus to finish the loading of boat 50. Thereafter, the compound source gas is introduced into the reactor 20 through the compound source gas inlet 11 of the base 10 while maintaining, using a vacuum equipment (not shown) and the heating means 70, both degree of vacuum and temperature of the reactor 20 suitable for vapor deposition process. The compound source gas in turn flows upward through the inlet pipe 60 coupled to the gas inlet 11.

During the upward flowing of the compound source gas through the gas inlet pipe 60, no gas comes into contact with the wafers W seated on the boat 50. However, the gas is sufficiently preheated and mixed by the heating means 70 while it reaches the top end of the pipe 60. At the top end of the pipe 60, the sufficiently preheated and mixed gas is ejected to the deposition reacting space S so as to come into contact with the wafers W of the boat 50. At this time, the gas is thermally decomposed and deposition-reacted so that the desired compound thin layers are deposited on the wafers W.

The reaction product generated from the above deposition of the thin layers is circulated, as shown at the arrow of FIG. 1, at the top section of the quartz tube 21 of the reactor 20 by the absorption force of the vacuum equipment (not shown) and, thereafter, discharged from the reactor 20 at the bottom section of the reactor 20 through the outlet 12 of the base 10.

At this time, the compound source gas introduced into the reactor 20 through the gas inlet 11 of the base 10 flows upward through the gas inlet pipe 60 coupled to the inlet 11. During the upward flowing of the gas through the pipe 60, the gas is such mixed that the desired sufficient mixing of the gas is achieved before the gas comes into contact with the uppermost wafers W of the boat 50. At the same time of above mixing, the gas is sufficiently preheated by the heating means 70 surrounding the quartz tube 21 of the reactor 20. Such sufficient preheating and mixing of the gas, a stable chemical thin layer is deposited on the uppermost wafer W of the boat 50. Hence, there is no contamination such as particles. The sufficiently preheated and mixed gas comes into contact with all of the wafers W on the boat 50 while flowing downward from the uppermost wafer to the lowermost wafer so that the heat efficiency is uniform through the whole section including the top section and the bottom section of the deposition reacting space S. With the uniform heat efficiency, the area wherein the thin layers are deposited on the wafers is enlarged. In addition, the uniform heat efficiency results in uniform doping effect so that the uniform quality and thickness of thin layers are deposited on the wafers and the thin layer deposition temperature is reduced. Furthermore, since the growing velocity of the thin layer is remarkably increased, the processing time is reduced by at least 20%.

During the introduction of compound source gas through the inlet pipe 60, the heat of the heating means 70 is nearly directly transferred to the gas through only the quartz tube 21 of the reactor 20 so that the preheating and heating effect of the gas is remarkably improved. This allows the power, requiring in heating and retaining the inside temperature of the reactor 20 to and at a predetermined appropriate temperature, to be saved. In addition, the inside temperature of the reactor 20 is easily controlled.

Figure 15:
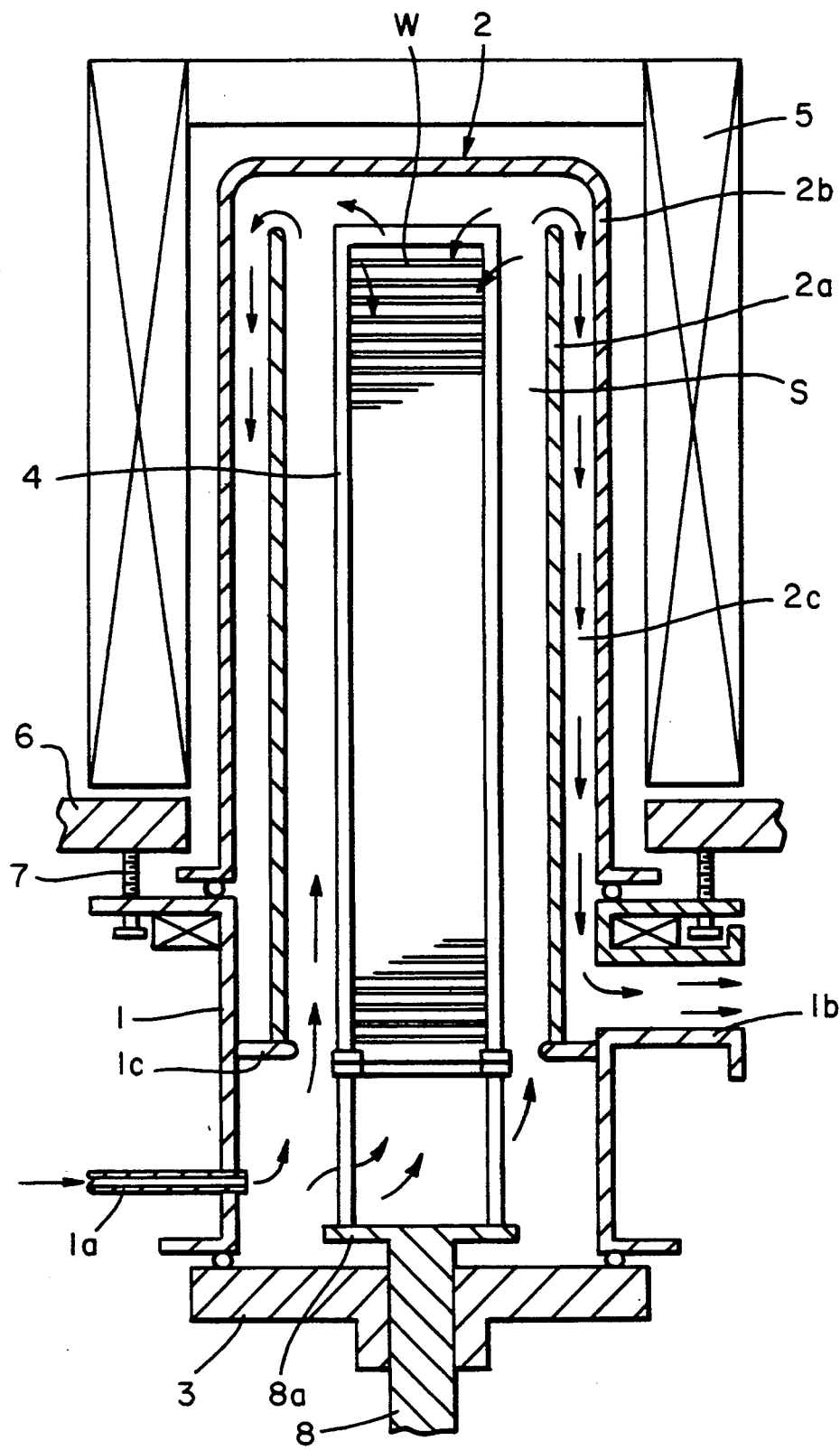
FIG. 15 is a sectional view of a typical LPCVD apparatus, showing the operation of the apparatus.
Figure 16:
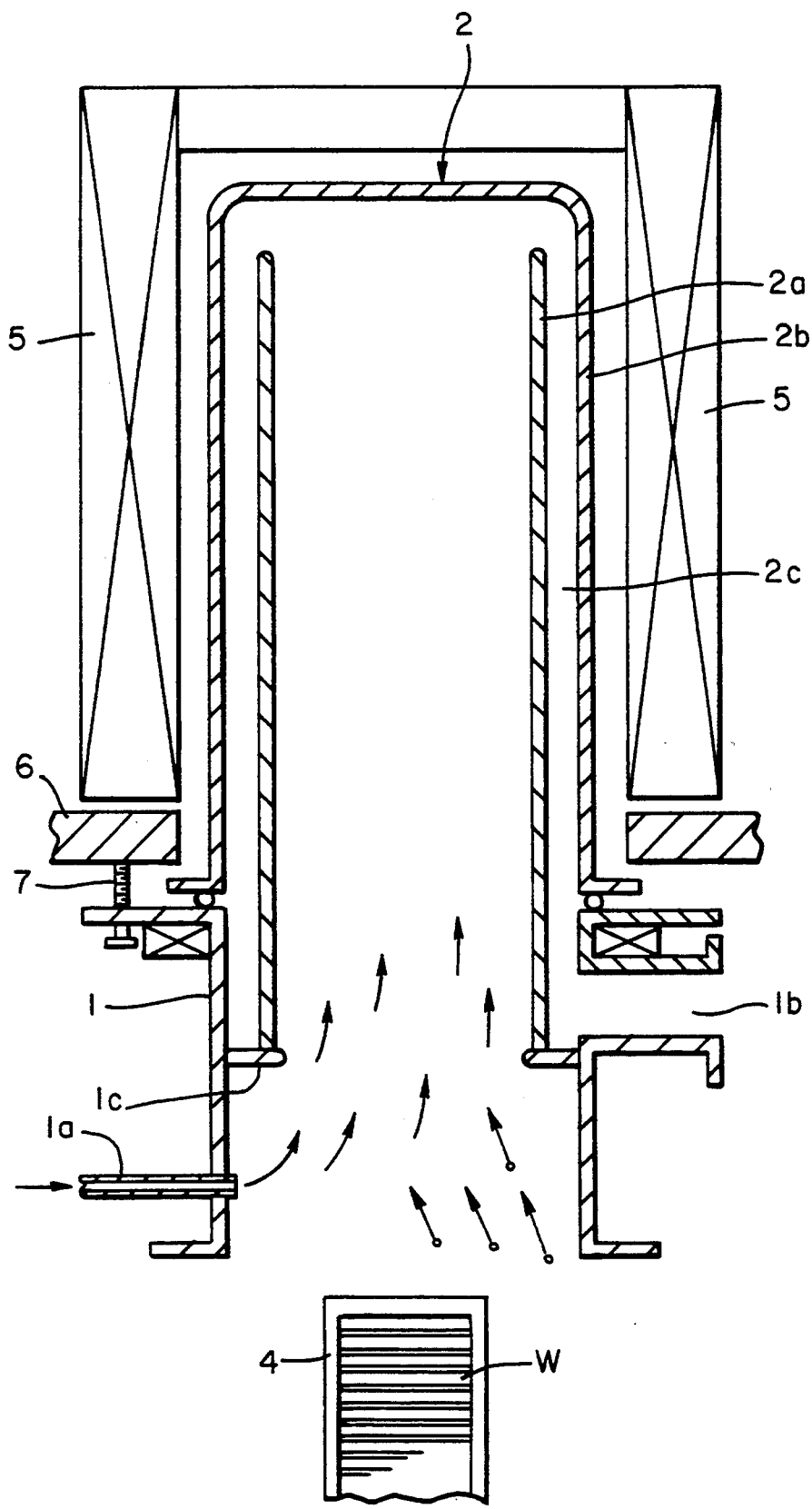
FIG. 16 shows the typical LPCVD apparatus of FIG. 15 free from a boat.

In order to prevent the possible native oxide formed on the wafers, the $N_2$ gas or the inert gas should be introduced into the reactor 20 under the condition that the bottom of the base 10 is opened and the boat 50 as well as the wafers W is removed from the reactor 20. In this case, the $N_2$ gas of the present invention is introduced into the reactor 20 through the gas inlet 11 of the base 10 unlike the typical LPCVD apparatus of FIGS. 15 and 16. In the same manner as described for the compound source gas, the $N_2$ gas introduced through the inlet 11 flows upward through the gas inlet pipe 60 until it is ejected from the pipe 60 at about the top section of the quartz tube 21 of the reactor 20. The $N_2$ gas in turn flows downward through the inside of the quartz tube 21 and discharged from the reactor 20 through the outlet 12 of the base while forming a downward current in the quartz tube 21. With the downward current of the $N_2$ gas in the tube 21, the oxygen is thus prevented from introduction into the reactor 20 through the bottom opening of the base 10 unlike the typical apparatus. Therefore, no oxide is formed on the wafers W and this remarkably reduces the fraction defective of the result wafers.

Figure 3:
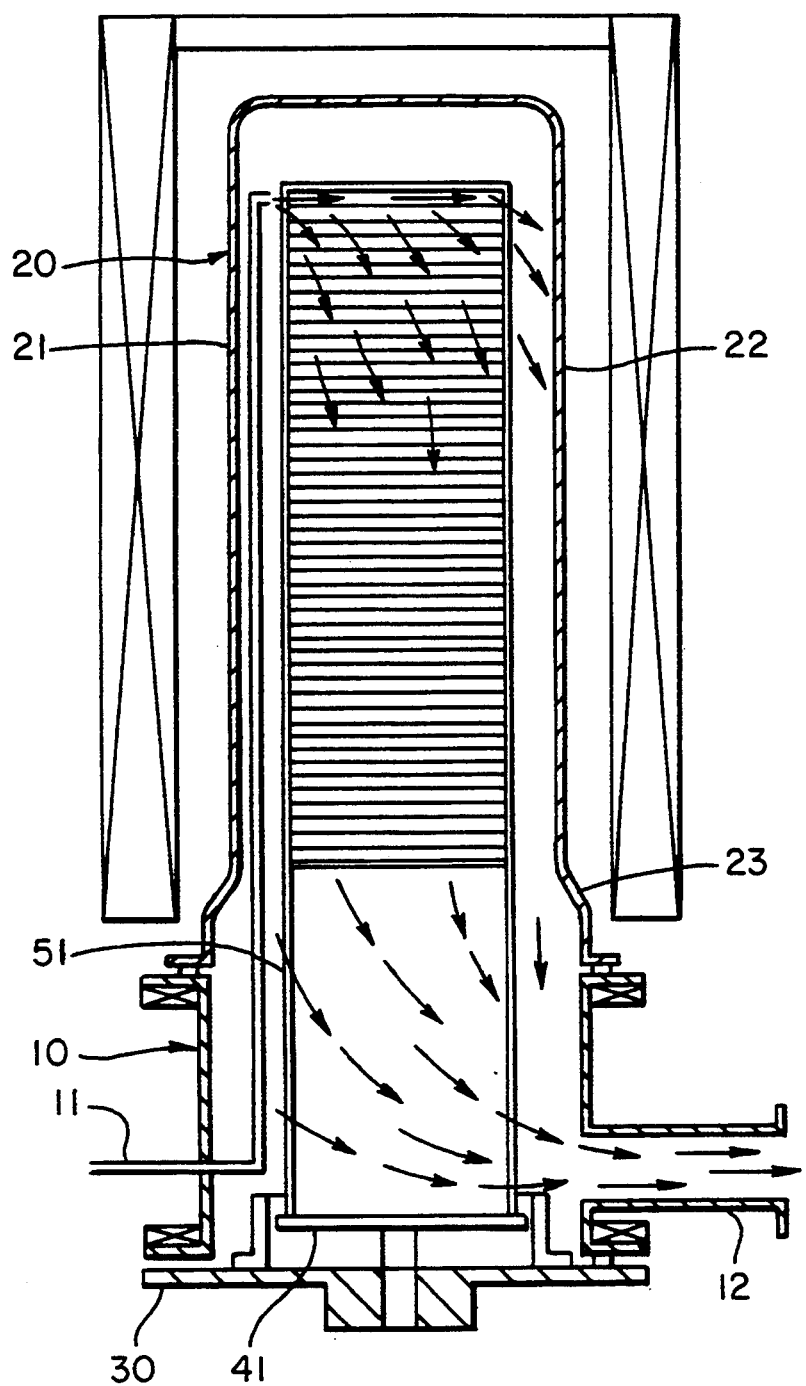
FIG. 3 is a sectional view showing a reactor in accordance with a second embodiment of the present invention.

Turning to FIG. 3, there is shown a reactor 20 in accordance with a second embodiment of the present invention. In this second embodiment, the quartz tube 21 of the reactor 20 comprises a larger diameter coupling part 22 and a reaction chamber part 23. The larger diameter coupling part 22 is provided at the lower section of the tube 21 and adapted for seating the tube 21 on the deposition base 10 while the reaction chamber part 23 extends upward from the coupling part 22 and has a smaller diameter than that of the coupling part 22. The second embodiment thus makes the gap between the inner surface of the reaction chamber part 23 of the tube 21 and the wafers W seated on the boat 50 becoming narrower, thus to achieve the smooth contact between the compound source gas and the wafers W.

As well known to those skilled in the art, the thickness uniformity of thin layers of the wafers W of LPCVD is influenced by the gap between the inner surface of the quartz tube 21 and the boat 50 like a conventional HTO (high temperature oxide deposition). In order to achieve the desired thickness uniformity of the chemical thin layers, the present invention reduces the inner diameter of the reaction chamber part 23 of the quartz tube 21, thus to make the gap between the reaction chamber part 23 and the wafers W of the boat 50 becoming narrower. The LPCVD apparatus of the present invention thus achieves the good deposition result of forming of uniform thickness of thin layers on the wafers W.

Figure 4:
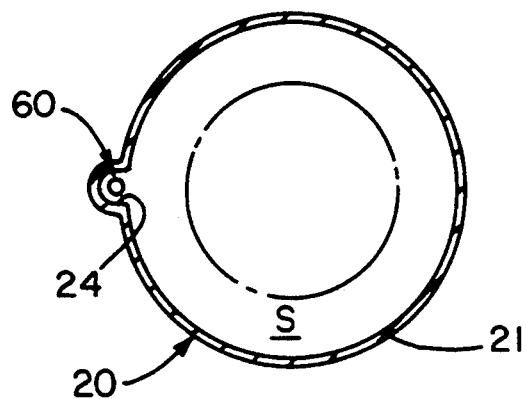
FIG. 4 is a sectional view showing a reactor in accordance with a third embodiment of the present invention.

FIG. 4 is a cross sectional view of a reactor 20 in accordance with a third embodiment of the present invention. In this third embodiment, the quartz tube 21 of the reactor 20 is provided on its side wall with a vertical groove 24 for receiving the gas inlet pipe 60 therein. Hence, the gas inlet pipe 60 of this third embodiment is received in the quartz tube 21. However, the pipe 60 causes no restriction in circulation of the compound source gas in the deposition reacting space S in the reactor 20 since the pipe 60 is recessed in the groove 24. In accordance with this third embodiment, an excellent deposition result is achieved.

Figure 5A:
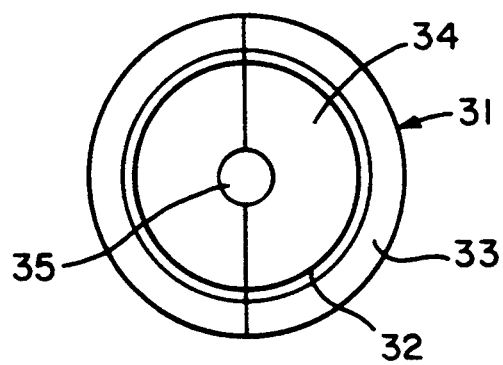
FIGS. 5A and 5B are a plan view and a cross sectional view of a deposition preventing ring in accordance with another embodiment of the present invention.
Figure 5B:
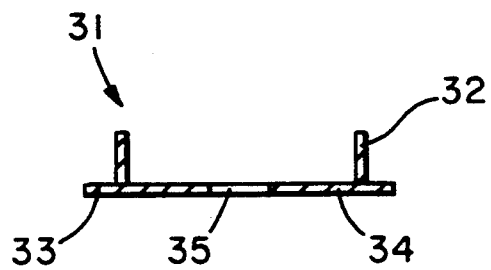

FIGS. 5A and 5B are a plan view and a cross sectional view of a deposition preventing ring 31 in accordance with another embodiment of the present invention. In this ring 31, a bottom plate 34 is integrally formed with the bottom surface of the cylindrical body 32 such that it is placed on the same plane of the flange 33. The bottom plate 34 is provided at its center with a ram passing hole 35 for receiving the boat lifting ram 40. With the ring 31 of this embodiment, the possible deposition of the thin layer on the closing plate 30 is completely prevented while giving no influence upon the lifting motion of the boat lifting ram 40.

In the above embodiments shown in FIGS. 3 to 5B, the other elements except for the specifically mentioned elements and their operational effects are same with them of the primary embodiment of FIGS. 1 and 2 and, therefore, those elements common to both the primary embodiment of FIGS. 1 and 2 and the other embodiments of FIGS. 3 to 5B thus carry the same reference numerals and further explanation is not deemed necessary.

Figure 6:
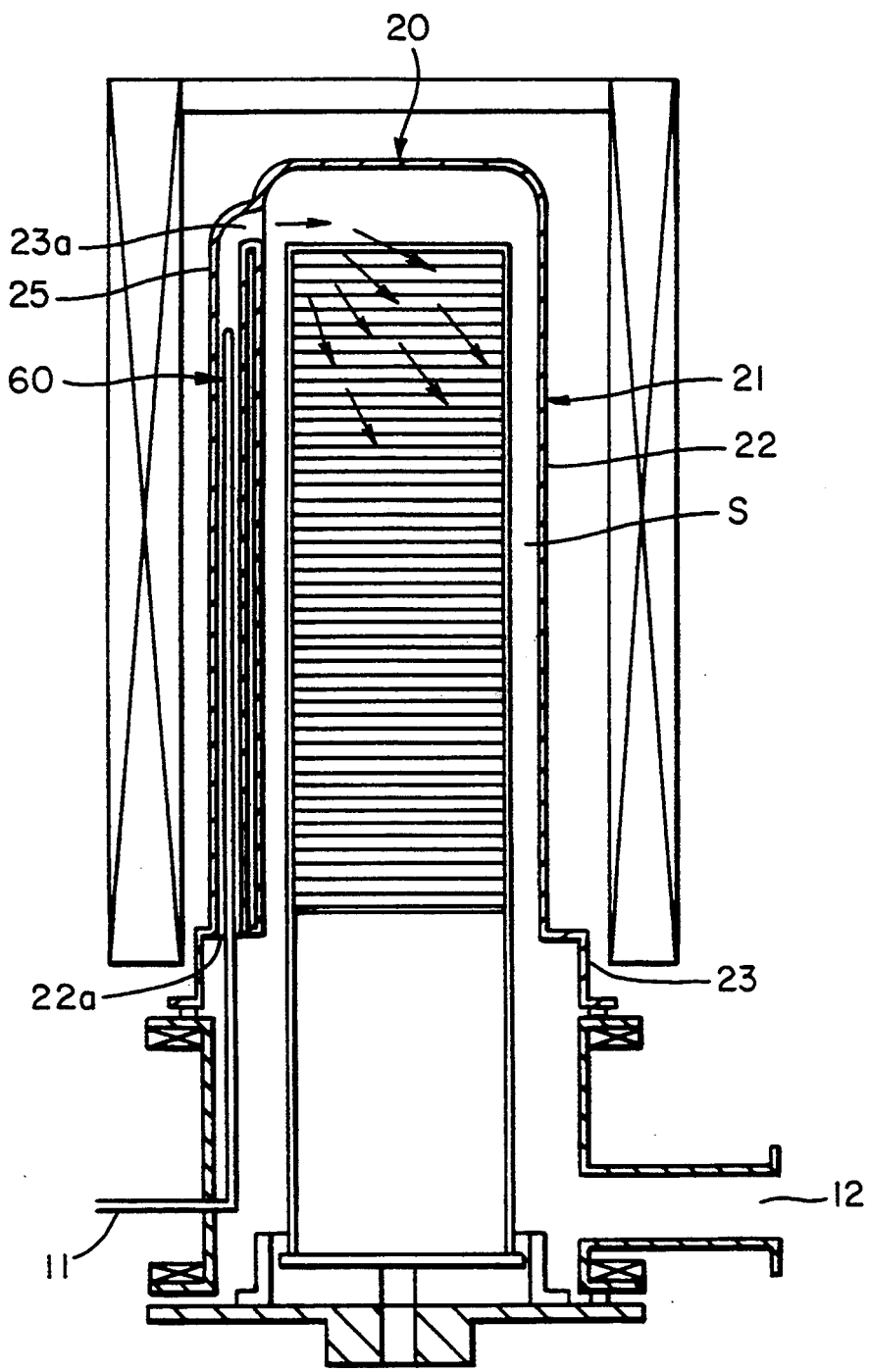
FIGS. 6 and 7 are sectional views of LPCVD apparatus in accordance with fourth and fifth embodiments of the present invention respectively.
Figure 7:
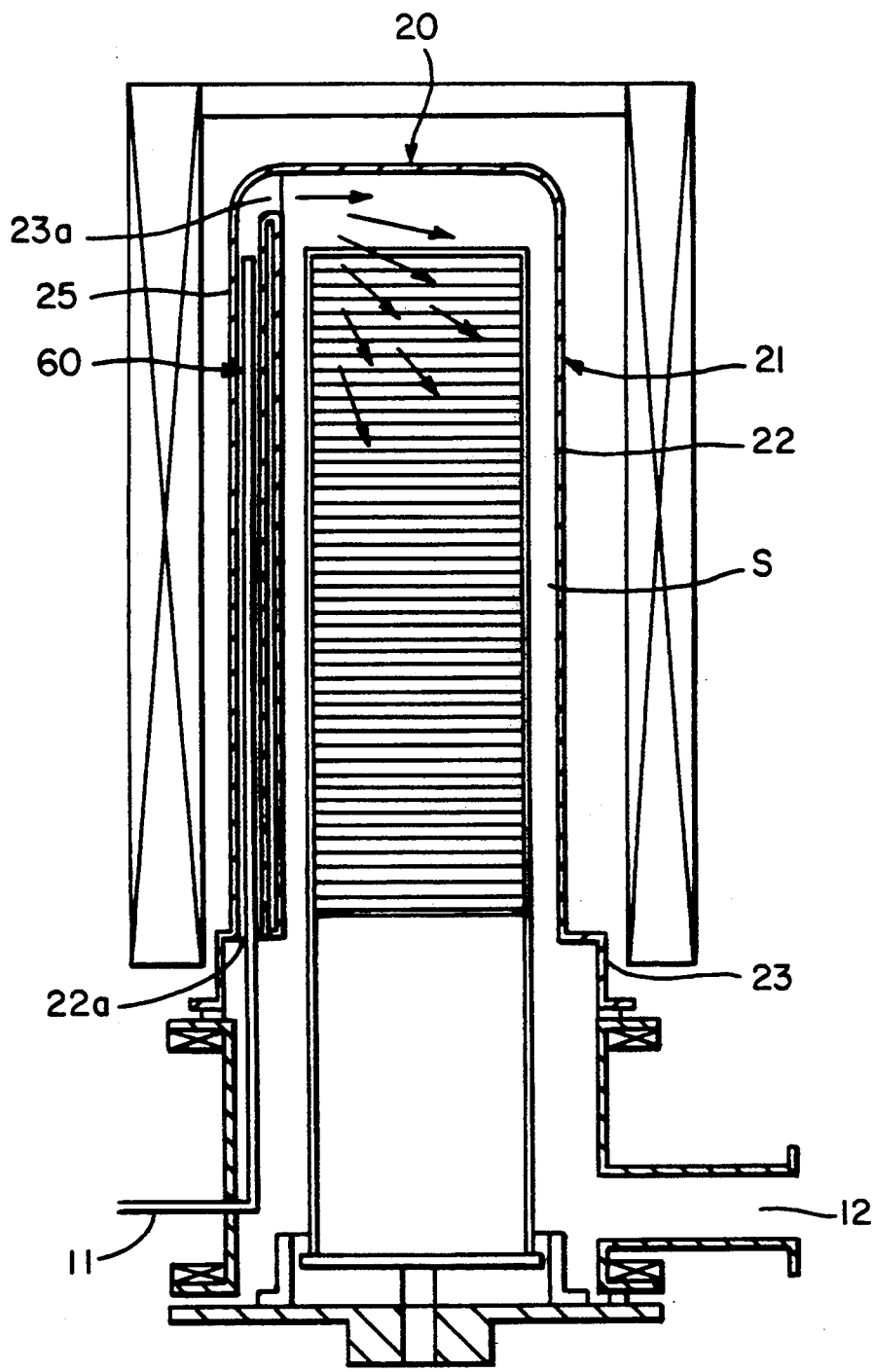

Turning to FIGS. 6 and 7, there are shown in sectional views LPCVD apparatus in accordance with fourth and fifth embodiments of the present invention respectively. In these embodiments, the quartz tube 21 of the reactor 20 comprises a larger diameter coupling part 22 and a reaction chamber part 23. The larger diameter coupling part 22 is provided at the lower section of the tube 21 and adapted for seating the tube 21 on the deposition base 10 while the reaction chamber part 23 extends upward from the coupling part 22 and has a smaller diameter than that of the coupling part 22. A top side of the coupling part 22 and a top side wall of the reaction chamber part 23 are provided with their respective through holes 22a and 23a. The through holes 22a and 23a are connected to each other by a compound source gas conduit 25 which is in turn receives the gas inlet pipe 60 therein.

In the embodiment of FIG. 6, the through hole 23a of the chamber part 23, which is connected to the top end of the conduit 25, is formed at the tube 21 about the top end of the loaded boat 50 so that the compound source gas is ejected from the gas inlet pipe 60 at about the top end of the loaded boat 50. In the embodiment of FIG. 7, the through hole 23a of the chamber part 23, which is connected to the top end of the conduit 25, is formed at the uppermost end of the quartz tube 21 so that the compound source gas is ejected from the gas inlet pipe 60 at a position above the top end of the loaded boat 50. In the above fourth and fifth embodiments, the other elements except for the specifically mentioned elements and their operational effects are same with the primary embodiment of FIGS. 1 and 2 and, therefore, those elements common to both the primary embodiment and the fourth and fifth embodiments thus carry the same reference numerals and further explanation is not deemed necessary.

Particularly in the above fourth and fifth embodiments, the gap between the inner surface of the quartz tube 21 and the loaded boat 50 becomes narrower so that the thickness uniformity of the chemical thin layers of the wafers W is improved. With the improved thickness uniformity of the chemical thin layers, the LPCVD apparatus according to the above fourth and fifth embodiments are particularly preferably used in a difficult process such as of HTO wherein it is difficult to achieve the desired thickness uniformity of the chemical thin layers. In addition, the gas inlet pipe 60 is integrally coupled to the outer surface of the quartz tube 21 and lets the compound source gas be sufficiently preheated and mixed. In this regard, the above fourth and fifth embodiments achieve improved characteristics of the chemical thin layers of the wafers and yield uniform thickness of layers deposited on the wafers.

Figure 8:
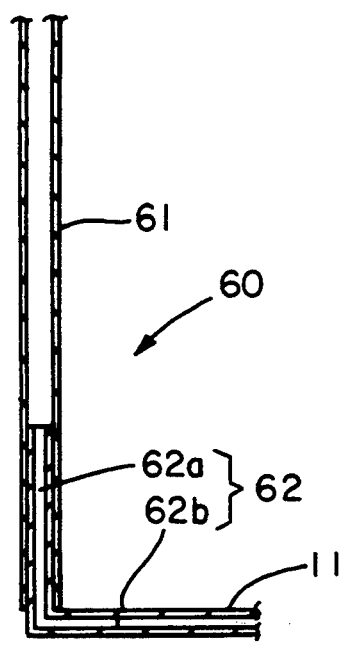
FIGS. 8 and 9 show compound source gas inlet pipes in accordance with other embodiments of the present invention respectively.
Figure 9:
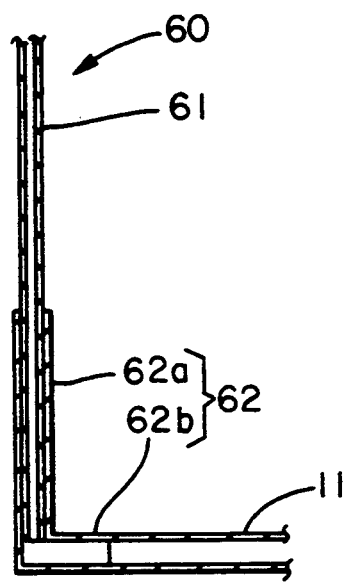

FIGS. 8 and 9 show compound source gas inlet pipes 60 in accordance with other embodiments of the present invention respectively. In these embodiments, each of the gas inlet pipes 60 comprises a vertical inlet pipe 61, which is received in a side of the quartz tube 21 or in a compound gas conduit 25 of the tube 21. The gas inlet pipe 60 further includes an introduction pipe 62 which, connects the compound source gas inlet 11 of the base 10 to the above vertical inlet pipe 61. In accordance with the structures of the above embodiments of FIGS. 8 and 9, it is easy to fix the gas inlet pipe 60 to the base 10 and to insert and install the pipe 60 in the quartz tube 21 of the reactor 20.

The vertical inlet pipe 61 is a simple linear pipe while the introduction pipe 62 comprises a short vertical section 62a and a horizontal section 62b. The introduction pipe 62 is coupled to the gas inlet 11 of the base 10 at its horizontal section 62b. In the embodiment of FIG. 8, the vertical section 62a of the introduction pipe 62 is inserted into the bottom section of the vertical inlet pipe 61. On the contrary, the bottom section of the vertical inlet pipe 61 of the embodiment of FIG. 9 is inserted into the vertical section 62a of the introduction pipe 62.

Figure 10:
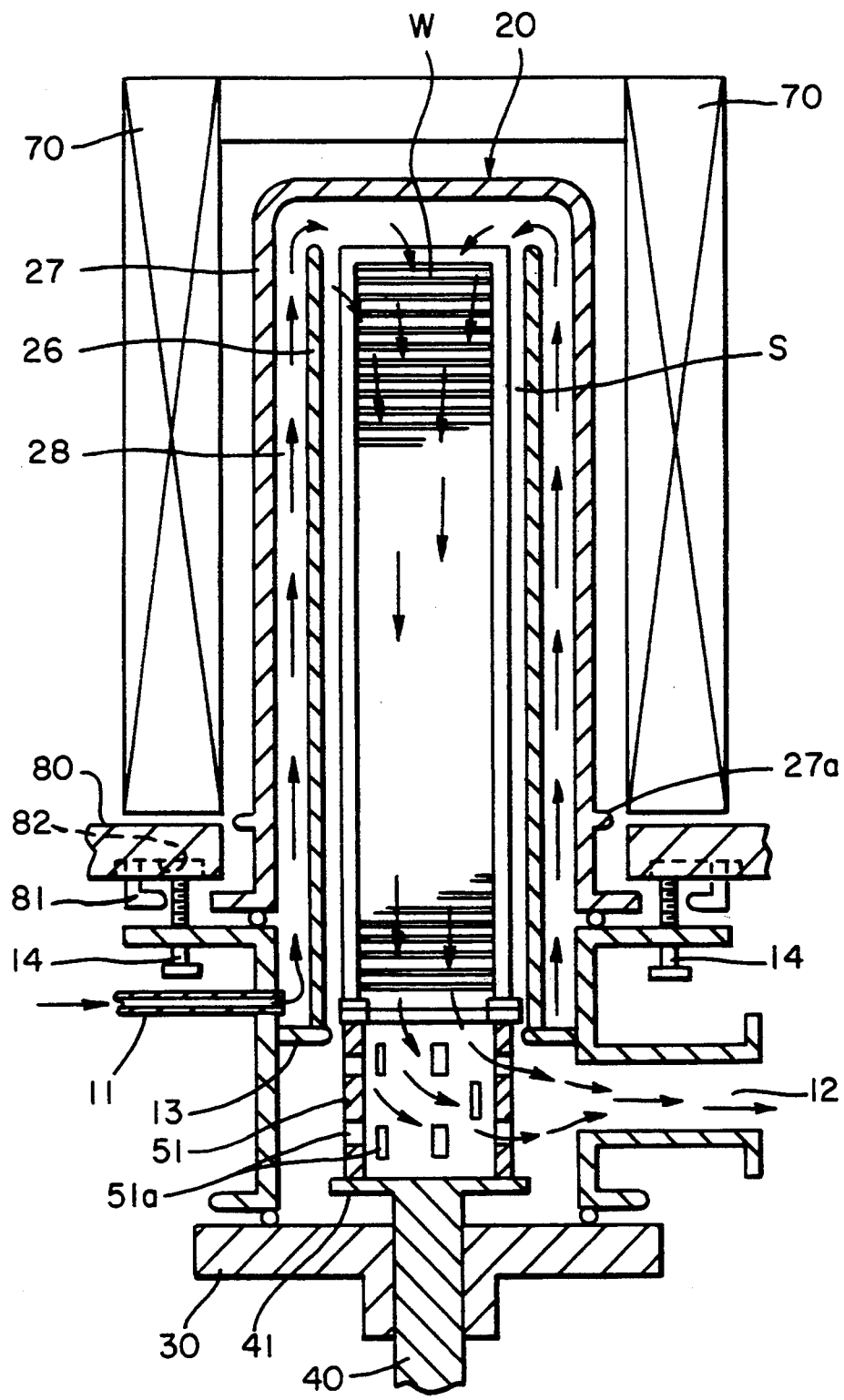

FIG. 10 shows LPCVD apparatus in accordance with a sixth embodiment of the present invention. In this sixth embodiment, the reactor 20 comprises an inside quartz tube 26 and an outside quartz tube 27. The inside tube 26 is opened at its top and at its bottom. The outside tube 27 surrounding the inside tube 26 is opened at its bottom but closed at its top. In this embodiment, a compound source gas flow path 28 is defined between the inside and outside tubes 26 and 27 of the reactor 20. The path 28 communicates with the gas inlet 11 of the base 10 at its bottom section. The top section of path 28 communicates with the deposition reacting space S defined in the inside tube 26. The bottom section of the path 28 is hermetically closed by an annular support 13 which inwardly extends from the inner surface of the base 10 and supports the bottom end of the inside tube 26. With the above path 28 defined between the inside and outside tubes 26 and 27 of the reactor 20, the compound source gas is introduced into the bottom section of the path 28 through the inlet 11 of the base 10 and in turn flows upward along the path 28 until it is introduced into the deposition reacting space S in the inside tube 26 at the top of the tube 26.

In the embodiment of FIG. 10, the annular support 13 of the base 10 is positioned such that it is lower than the gas inlet 11 of the base 10 but higher than the reaction product outlet 12. In this regard, the bottom of the inside tube 26 of the reactor 20 is positioned such that it is lower than the inlet 11 but higher than the outlet 12 of the base 10.

The outside tube 27 of the reactor 20 is provided with outside projection means 27a on its lower section. In order to support the projection means 27a of the outside tube 27, the apparatus housing 80 is provided with a slide support 81.

The outside projection means 27a of the tube 27 may comprise an annular projection radially outward extending from the outer surface of the lower section of the tube 27. Alternatively, the means 27a may comprise at least two projections radially outward extending from the outer surface of the lower section of the tube 27. Meanwhile, the slide support 81 is formed in an L-shape and received in the guide slot 82 of the housing 80 such that it is movable in inward and outward directions. The slide support 81 may be manually moved or automatically moved such as by a pneumatic or hydraulic cylinder, a solenoid and a motor.

The boat 50 is mounted on the top surface of the boat support 41 of the ram 40 by the boat support member 51. The support member 51 is perforated with a plurality of perforations 51a so as to become a perforated member. In the present invention, it is preferred to form two to ten perforations 51a on the support member 51.

In the above sixth embodiment, the other elements except for the specifically mentioned elements and their operational effects are same with the primary embodiment and, therefore, those elements common to both the primary embodiment and this sixth embodiment thus carry the same reference numerals.

In operation of the above sixth embodiment, the boat 50 with the plurality of wafers W are first inserted into the deposition reacting space S of the reactor 20. After the insertion of the boat 50 into the reactor 20, the bottom of the base 10 is closed by the closing plate 30, thus to finish the loading of boat 50. Thereafter, the compound source gas is introduced into the reactor 20 through the compound source gas inlet 11 of the base 10 while maintaining, using the vacuum equipment (not shown) and the heating means 70, both degree of vacuum and temperature of the reactor 20 suitable for vapor deposition process. The compound source gas in turn flows upward through the compound source gas flow path 28 communicating with the gas inlet 11.

During the upward flowing of the compound source gas through the gas flow path 28, no gas comes into contact with the wafers W seated on the boat 50. However, the gas is sufficiently preheated and mixed by the heating means 70 while it reaches the top end of the path 28. At the top end of the path 28, the sufficiently preheated and mixed gas is ejected to the deposition reacting space S so as to come into contact with the wafers W of the boat 50. At this time, the gas is thermally decomposed and deposition-reacted so that the desired compound thin layers are deposited on the wafers W.

The reaction product generated from the above deposition of the thin layers flows, as shown at the arrow of FIG. 10, from the top section of the reactor 20 to the bottom section of the inside tube 26 through the deposition reacting space S by the absorption force of the vacuum equipment (not shown). The reaction product is, thereafter, discharged from the reactor 20 at the bottom section of the reactor 20 through the outlet 12 of the base.

At this time, the compound source gas introduced into bottom section of the path 28 through the gas inlet 11 of the base 10 flows upward through the gas flow path 28 defined between the inside and outside tube 26 and 27 of the reactor 20. During the upward flowing of the gas through the path 28, the gas is such mixed that the desired sufficient mixing of the gas is achieved before the gas comes into contact with the uppermost wafers W of the boat 50. At the same time of above mixing, the gas is sufficiently preheated by the heating means 70 surrounding the outside tube 27 of the reactor 20. Such sufficient preheating and mixing of the gas, a stable chemical thin layer is deposited on the uppermost wafer W of the boat 50. Hence, there is no contamination such as particles. The sufficiently preheated and mixed gas comes into contact with all of the wafers W on the boat 50 while flowing downward from the uppermost wafer to the lowermost wafer so that the heat efficiency is uniform through the whole section including the top section and the bottom section of the deposition reacting space S. With the uniform heat efficiency, the area wherein the thin layers are deposited on the wafers is enlarged. In addition, the uniform heat efficiency results in uniform doping effect so that the uniform quality and thickness of thin layers are deposited on the wafers W and the thin layer deposition temperature is reduced. Furthermore, since the growing velocity of the thin layer is remarkably increased, the processing time is reduced by at least 20%.

During the introduction of compound source gas through the path 28, the heat of the heating means 70 is nearly directly transferred to the gas through only the outside tube 27 of the reactor 20 so that the preheating and heating effect of the gas is remarkably improved. This allows the power, requiring in heating and retaining the inside temperature of the reactor 20 to and at a predetermined appropriate temperature, to be saved. In addition, the inside temperature of the reactor 20 is easily controlled.

Figure 11:
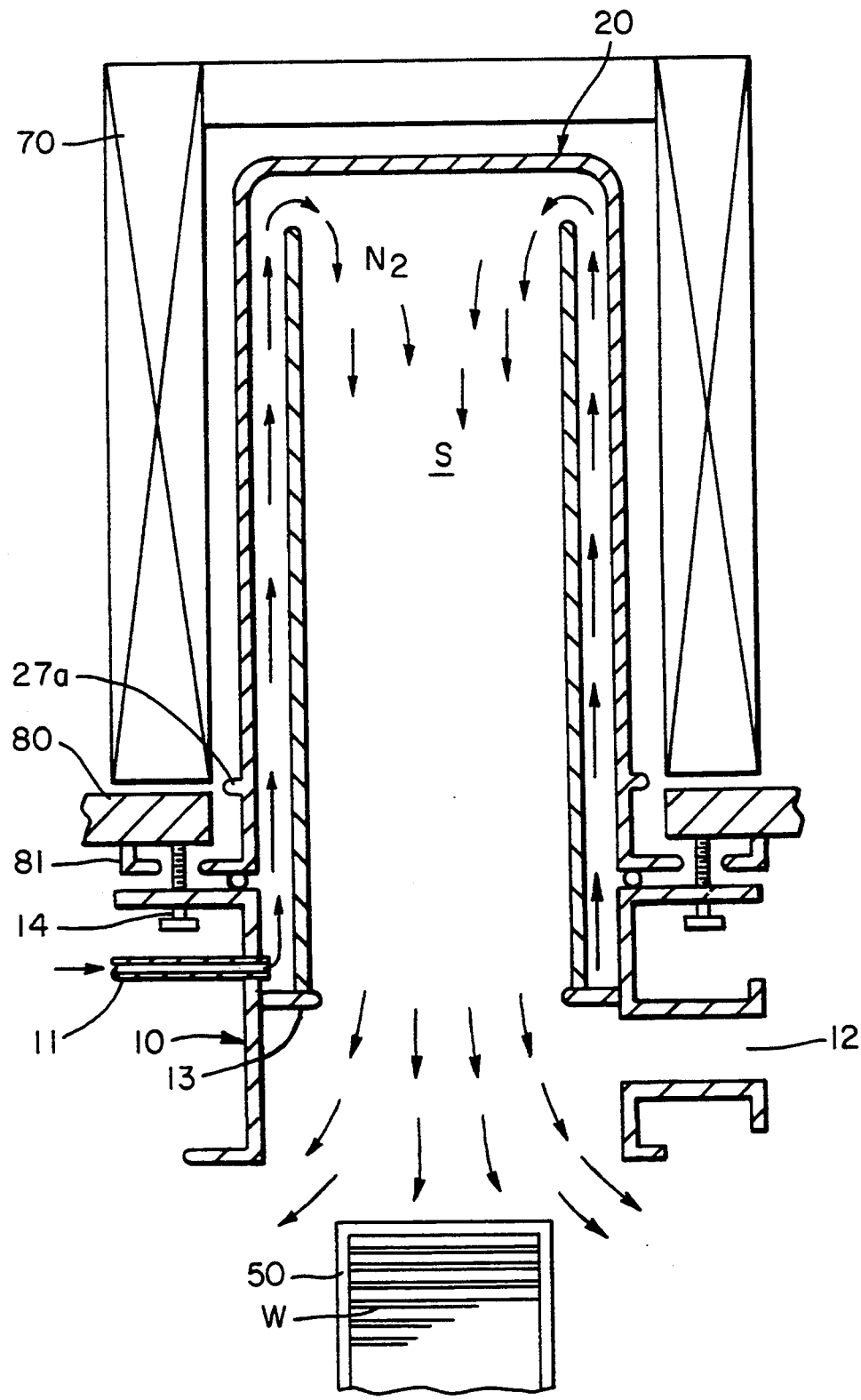

In order to prevent the possible native oxide formed on the wafers W, the $N_2$ gas or the inert gas should be introduced into the reactor 20 under the condition that the bottom of the base 10 is opened and the boat 50 as well as the wafers W is removed from the reactor 20 as shown in FIG. 11. In this case, the $N_2$ gas of the present invention is introduced into the reactor 20 through the gas inlet 11 of the base 10 unlike the typical LPCVD apparatus of FIGS. 15 and 16. In the same manner as described for the compound source gas, the $N_2$ gas introduced through the inlet 11 flows upward through the gas flow path 28 until it is ejected from the path 28 at about the top section of the inside tube 26 of the reactor 20. The $N_2$ gas in turn flows downward through the inside of the inside tube 26 and discharged from the reactor 20 through the outlet 12 of the base 10 while forming a downward current in the inside tube 26. With the downward current of the $N_2$ gas in the tube 26, the oxygen is thus prevented from introduction into the inside tube 26 through the bottom opening of the base 10 unlike the typical apparatus. Therefore, no oxide is formed on the wafers W and this remarkably reduces the fraction defective of the result wafers.

Figure 12A:
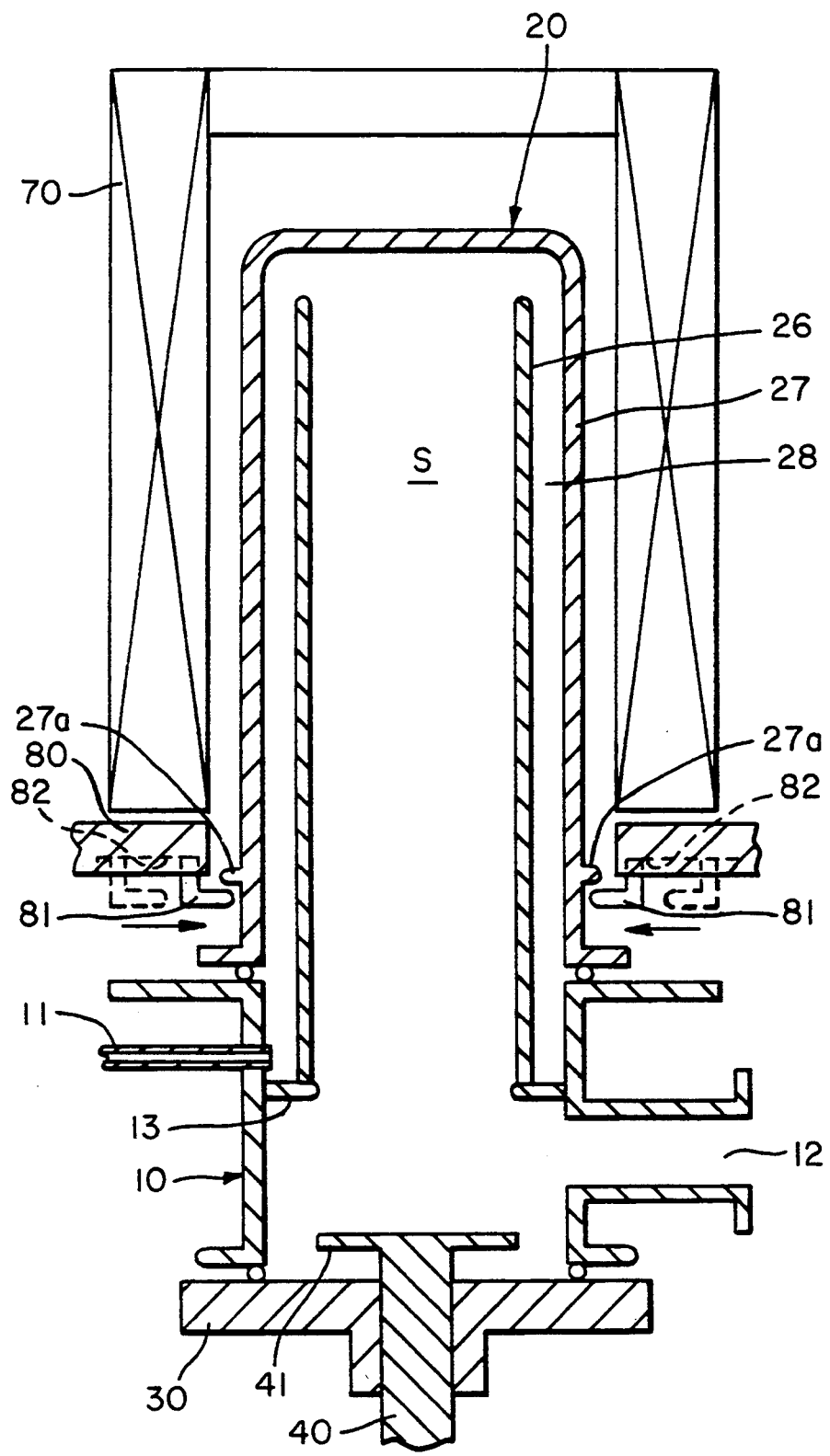
Figure 12B:
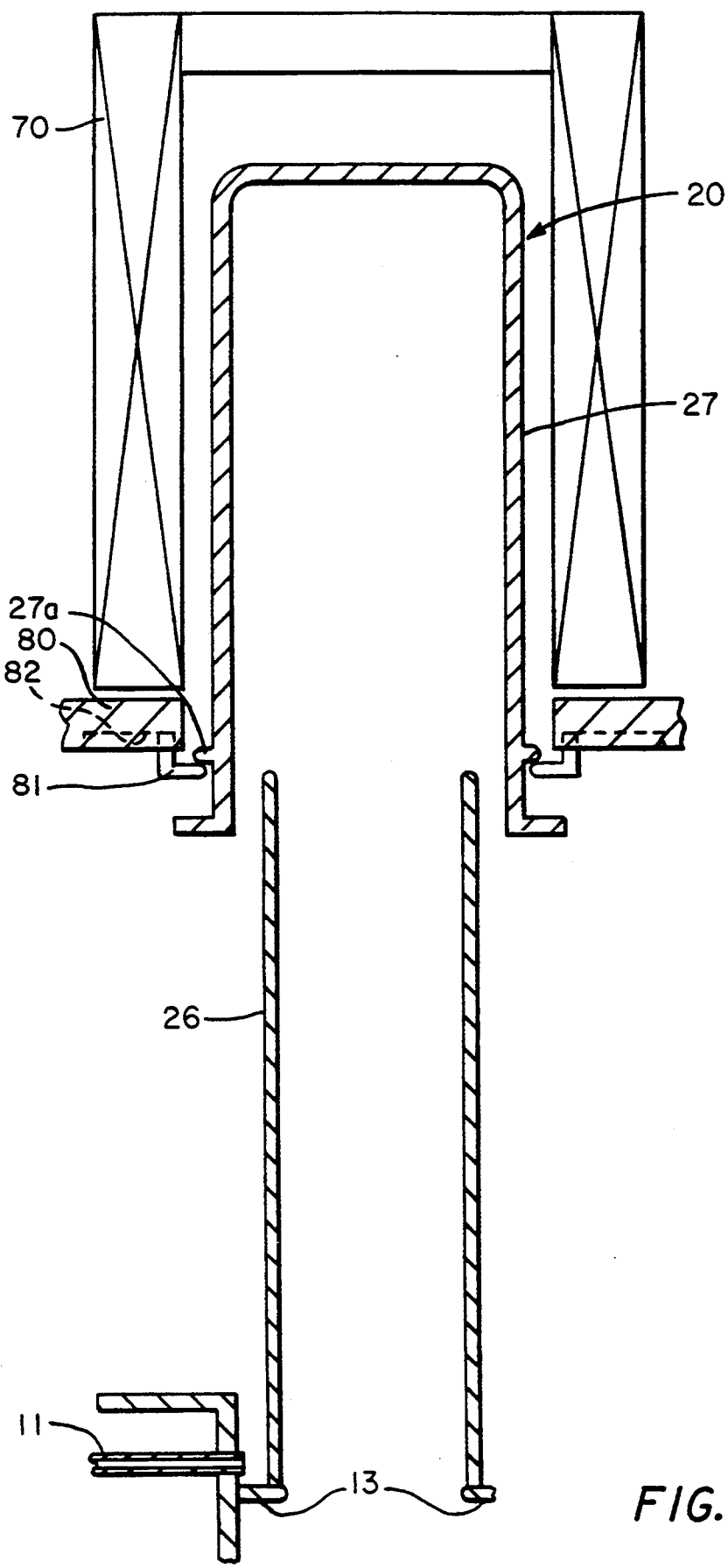
Figure 12C:
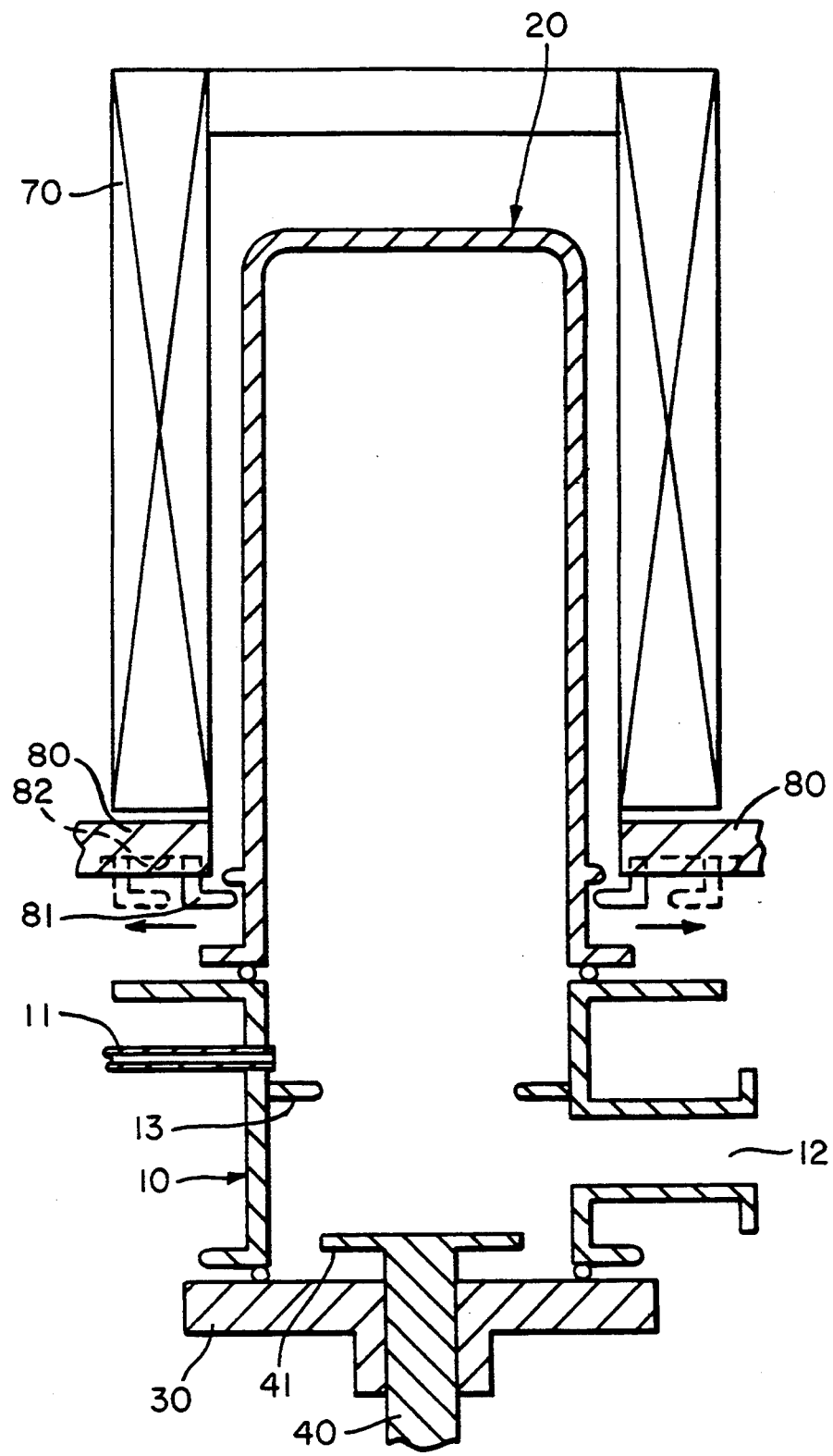

When chemical thin layers are deposited on the inside and outside tubes 26 and 27 of the reactor 20 during the above deposition, the tubes 26 and 27 should be washed or substituted with new tubes. In order to separate the tubes 26 and 27 so as to wash or substitute them with new tubes, the closing plate 30 is fully downed and, thereafter, the boat 50 is separated from the boat support 41 of the boat lifting ram 40. The separation of the boat 50 from the boat support 41 is followed by lifting of the closing plate 30 as shown in FIG. 12C. As a result of lifting of the closing plate 30, the deposition base 10 is supported by the closing plate 30. The fixing bolts 14 are, thereafter, loosened so as to separate the base 10 from the housing 80. When separating the base 10 from the housing 80, the base 10 is supported only by the housing 80. When the closing plate 30 is downed at the above state, the inside and outside tubes 26 and 27 of the reactor 20 are downed along with the base 10. When the closing plate 30 is, thereafter, slowly downed while moving the slide support 81 of the housing 80 inwardly as shown in FIG. 12A, the outside tube 27 is not downed any more since its projection means 27a is stopped by the slide support 81 of the housing 80 as shown in FIG. 12B. However, the inside tube 26 is continuously downed so that it can be completely separated from the outside tube 27.

Figure 12D:
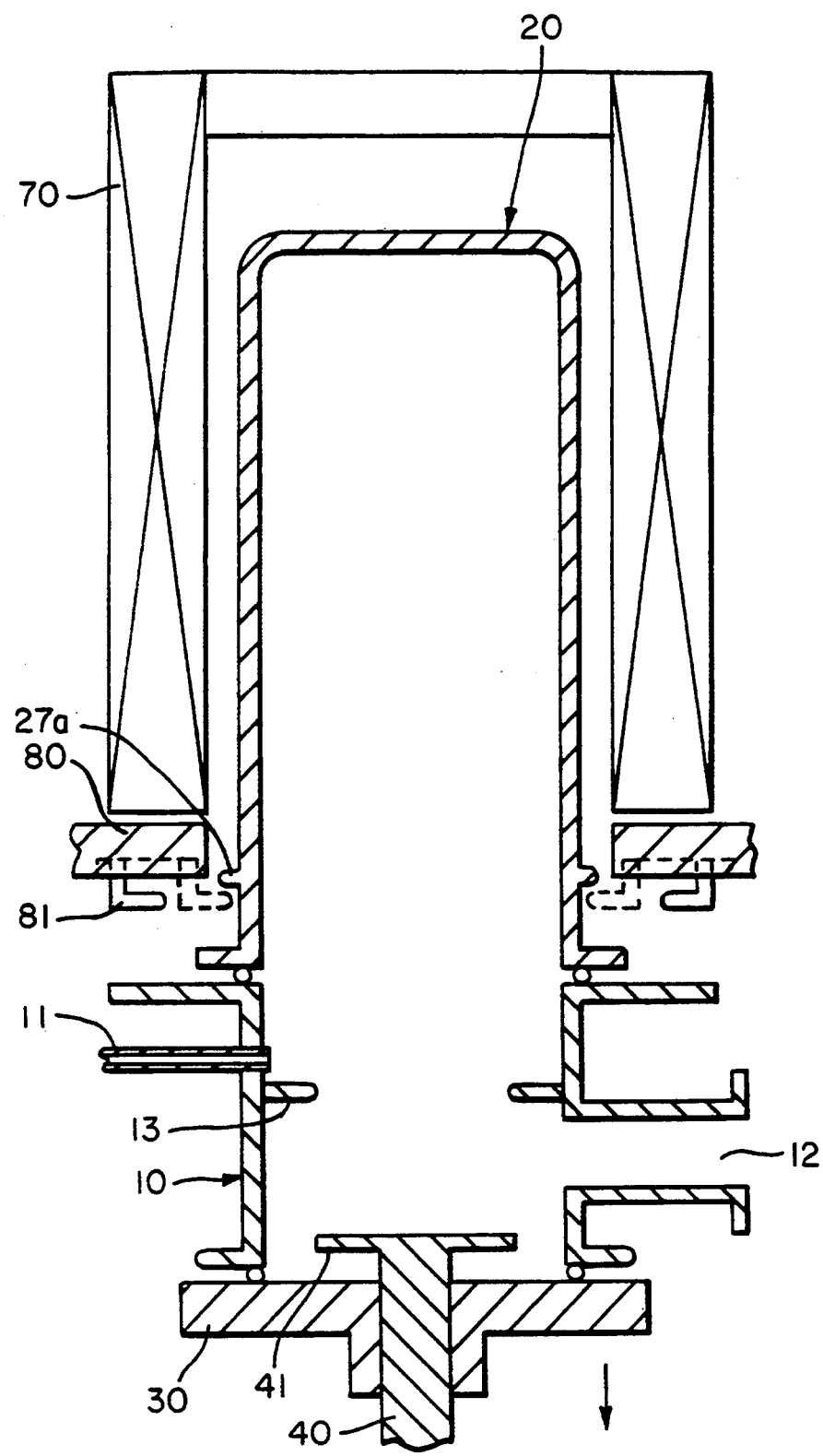

After separation of the inside tube 26 from the outside tube 27, the closing plate 30 is slightly lifted as shown in FIG. 12C so that its projection means 27a is slightly separated from the slide support 81. At this state, the slide support 81 is moved outward as shown in FIG. 12D so that the outside tube 27 can be separated from the housing 80 and seated on the deposition base 10.

Figure 12E:
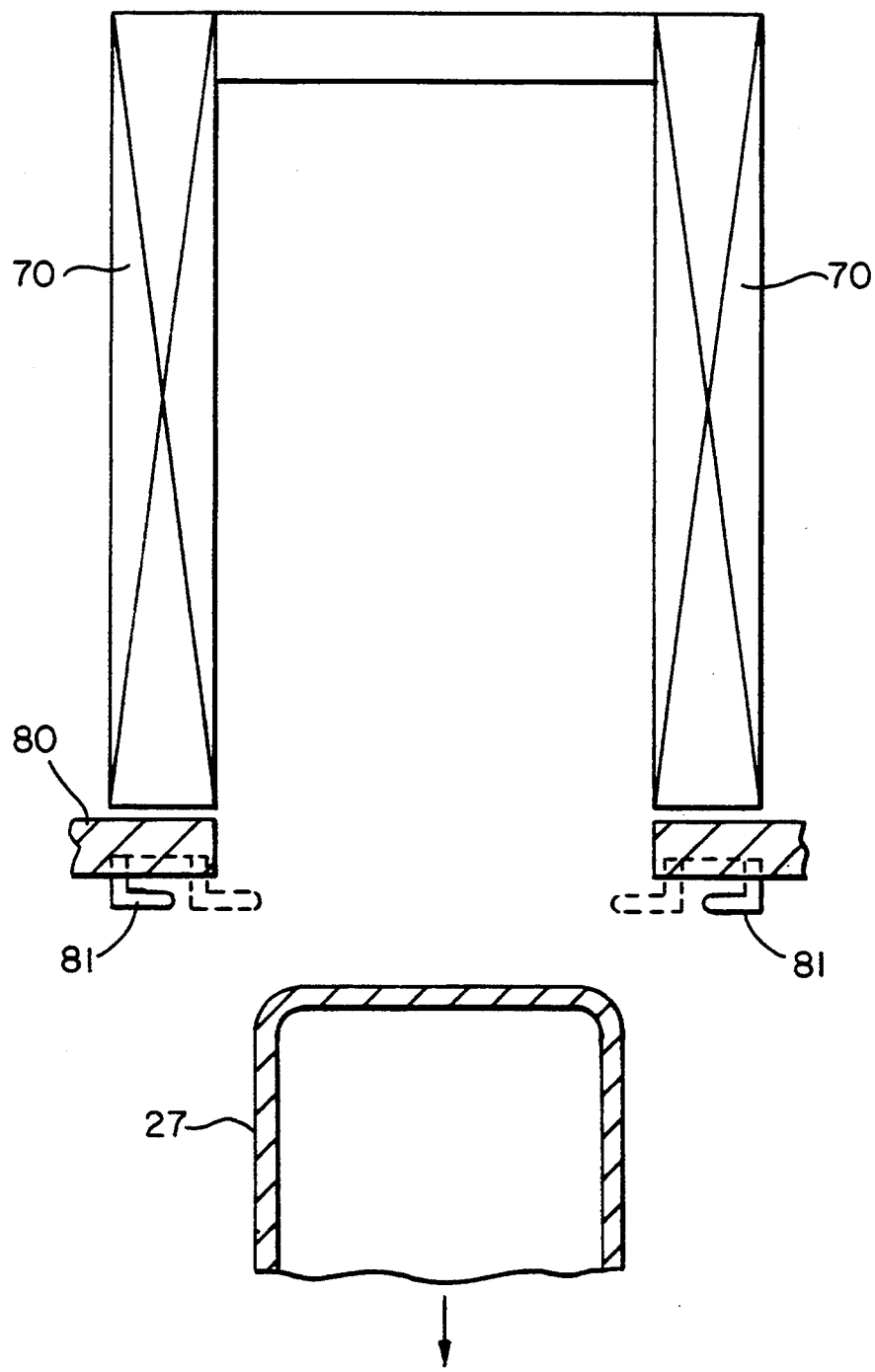

Thereafter, when the closing plate 30 is slowly downed, the outside tube 27 seated on the closing plate 30 is downed through the base 10 while retaining its position on the closing plate 30 as shown in FIG. 12E. When the outside tube 27 is completely free from the heating means 70 which has surrounded the tube 27, the outside tube 27 is completely separated from the housing 80, thus to finish the separation of the inside and outside tubes 26 and 27 of the reactor 20.

The assembling of the inside and outside tubes 26 and 27 of the reactor 20 will be achieved by reversing the above steps described for their separations.

Accordingly, the present invention simplifies the separation and assembling work of the inside and outside quartz tubes 26 and 27 of the reactor 20 for washing and substituting them with new tubes when they are deposited with the chemical thin layers as a result of deposition.

Figure 13:
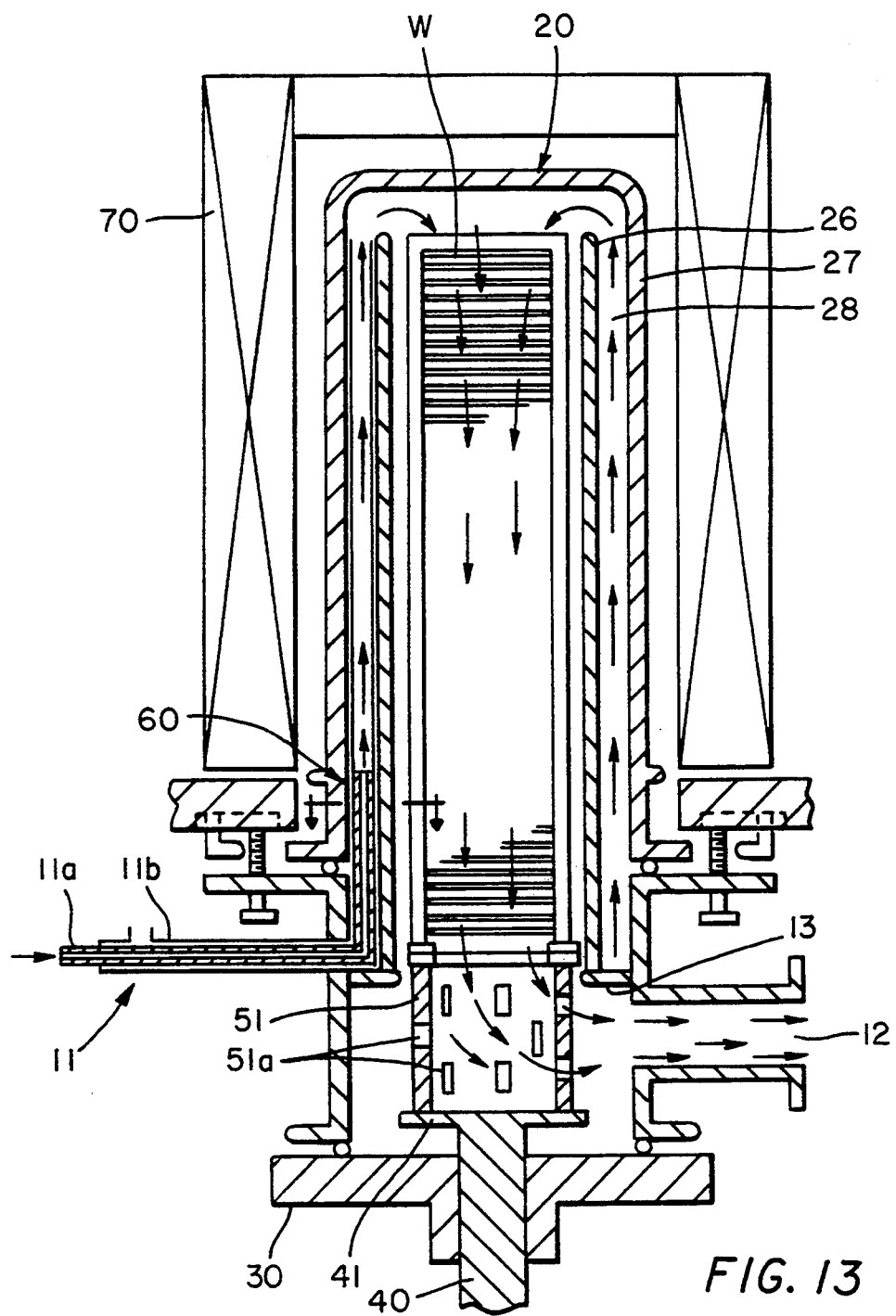
FIG. 13 is a sectional view of LPCVD apparatus in accordance with a seventh embodiment of the present invention.

Turning to FIG. 13, there is shown in a sectional view LPCVD apparatus in accordance with a seventh embodiment of the present invention. In this seventh embodiment, the compound source gas inlet 11 of the base 10 comprises an inside pipe 11a and an outside pipe 11b, thus to have a double pipe structure. This embodiment also has the gas flow path 28 of the same structure as that of the sixth embodiment of FIGS. 10 to 12E. The inside pipe 11a of the gas inlet 11 is connected to the bottom section of the path 28. The LPCVD apparatus of this seventh embodiment further includes a gas inlet pipe 60. The gas inlet pipe 60 comprises an inside pipe 63, which is placed such that its top end is leveled with the bottom end of the heating means 70, and an outside pipe 64 which is connected to the outside pipe 11b of the gas inlet 11 of the base 10 and surrounds the inside pipe 63. This embodiment is preferably used in introduction of two types of compound source gases into the reactor 20 at the same time. That is, when the two types of gases are simultaneously introduced into the reactor 20, the two gases are not mixed with each other in a low temperature range, which range does not maintain the eutectic temperature and extends to the top end of the inside pipe 63 of the gas inlet pipe 60. However, the two gases are mixed with each other in an eutectic temperature range, which range maintains the eutectic temperature and is distributed in the section over the top end of the inside pipe 63 of the gas inlet pipe 60. In this regard, the LPCVD apparatus of the seventh embodiment prevents generation of particles and achieves deposition of desired quality of thin layers on the wafers W.

Figure 14:
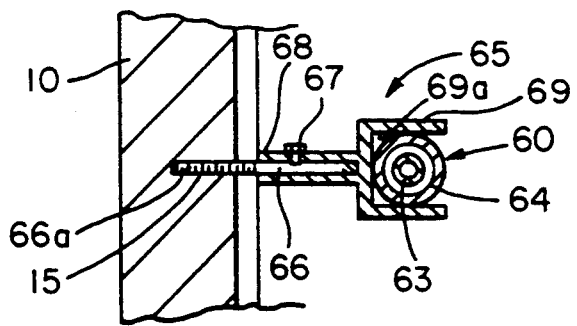
FIG. 14 is a partial enlarged sectional view showing the engagement of a compound source gas inlet pipe with a holder of the LPCVD apparatus of FIG. 13.

As shown in FIG. 14, the outside pipe 64 of the gas inlet pipe 60 is tightly held by a holder 65 of the deposition base 10 such that it is not played. With the tight fixing of the outside pipe 64 of the gas inlet pipe 60, the inside and outside pipes 63 and 64 of the gas inlet pipe 60 are reliably prevented from vibration during the deposition process, thus to prevent generation of particles.

The holder 65 comprises a fixing rod 66 which is fixed to the inner wall of the base 10. The fixing rod 66 is receives thereon a holding pipe 68 having a set screw 67. The set screw 67 is radially threaded into the side wall of the holding pipe 68. A grip 69 having a pipe holding space 69a for holding the gas inlet pipe 60 is formed on the distal end of the holding pipe 68.

The fixing rod 66 is provided with outer threaded end part 66a. The threaded end part 66a of the fixing rod 66 is threaded into an inner threaded hole 15 of the inner wall of the base 10, thus to fix the fixing rod 66 to the base 10. The projecting section of the fixing rod 66 receives thereon the holding pipe 68 having the grip 69. After insertion of the holding pipe 68 on the fixing rod 66, the set screw 67 is tightened so as to fix the holding pipe 68 with the grip 69 to the inner wall of the deposition base 10 through the fixing rod 66.

When radially moving the holding pipe 68 with respect to the fixing rod 66 so as to control the position of the pipe 68 with respect to the center of the reactor 20 or to control the height of the pipe 68 from the inner wall of the base 10 and, thereafter, tightening the set screw 67, the fixing of the gas inlet pipe 60 at an appropriate height is achieved.

As described above, the apparatus for low pressure chemical vapor deposition or the LPCVD apparatus in accordance with the present invention has a compound source gas flow path which is formed between the inside and outside quartz tubes of the reactor. With the path, the apparatus supplies the compound source gas from the upper section to the lower section of the reactor and lets the source gas be introduced into the deposition reacting space of the reactor while being sufficiently mixed and sufficiently heated and achieves the desired deposition result of uniform quality and thickness of chemical thin layers.

The LPCVD apparatus of this invention also prevents introduction of oxygen into the reactor when washing the quartz tubes of reactor using $N_2$ gas, thus to prevent forming of undesirable oxide on the wafers and to minimize the fraction defective of result wafers.

In LPCVD apparatus of this invention, the inside and outside quartz tubes of the reactor are easily separated and assembled with respect to the apparatus housing, thus to be easily washed or substituted with new tubes and to be produced in mass production with lower cost.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. Apparatus for low pressure chemical vapor deposition comprising:
    a deposition base having a compound source gas inlet and a reaction product outlet at opposed sides thereof;
    a reactor airtightly coupled to a top end of said deposition base at its bottom end;
    a closing plate provided on the bottom of said deposition base for selectively closing a bottom opening of said deposition base;
    a boat lifting ram movably penetrating a center opening of said closing plate, said ram being provided with a boat support on its top end;
    a boat seated on said boat support of the ram and supporting a plurality of wafers thereon;
    means for introducing a compound source gas to a top section of said reactor and ejecting said source gas at that top section of the reactor, said gas introducing means being connected to said compound source gas inlet of the base at its bottom end and positioned about a top section of said boat at its top end; and
    heating means for heating said reactor, said heating means surrounding said reactor.

2. The apparatus according to claim 1, wherein said reactor is a single quartz tube having a uniform diameter.

3. The apparatus according to claim 1, wherein said reactor comprises:
    a larger diameter coupling part, said coupling part being provided at the lower section of said reactor and seated on said deposition base; and
    a reaction chamber part extending upward from said coupling part and having a smaller diameter than that of said coupling part.

4. The apparatus according to claim 3, further comprising a pair of through holes provided at a top side of said coupling part and at a top side wall of said reaction chamber part respectively, said through holes being connected to each other by a compound source gas conduit, said conduit receiving said compound source gas introducing means therein.

5. The apparatus according to claim 1, wherein said reactor comprises:
    an inside quartz tube opened at its top and at its bottom;
    an outside quartz tube surrounding the inside tube and opened at its bottom but closed at its top; and
    a compound source gas flow path defined between said inside and outside tubes, said gas flow path communicating, at its bottom section, with said gas inlet of the deposition base and, at its top section, with a deposition reacting space defined in said inside tube, the bottom section of said gas flow path being hermetically closed by an annular support, said annular support being inwardly extending from an inner surface of said deposition base and supporting the bottom end of said inside quartz rude thereon.

6. The apparatus according to claim 5, further comprising a gas inlet pipe received in said gas flow path, said gas inlet pipe being connected to said gas inlet of the base at its bottom end and extending upward so as to reach the top end of said boat.

7. The apparatus according to claim 1 wherein said reactor is provided on its inner surface with a vertical groove for recessing said source gas introducing means therein.

8. The apparatus according to claim 1, wherein said source gas introducing means comprises:
   a vertical inlet pipe, the bottom of said vertical inlet pipe being leveled with said source gas inlet of the deposition base while the top of said vertical inlet pipe being leveled with the top end of said boat; and
   an introduction pipe for connecting said source gas inlet of the base to said vertical inlet pipe, said introduction pipe comprising a vertical section connected to said vertical inlet pipe and a horizontal section connected to said source gas inlet of the base.

9. The apparatus according to claim 1, wherein said source gas inlet of the deposition base comprises inside and outside pipes, and said source gas introducing means comprises inside and outside introducing pipes, said inside introducing pipe being connected to said inside pipe of the gas inlet of the base at its bottom end and leveled with the bottom end of said heating means at its top end, said outside introducing pipe being connected to said outside pipe of the gas inlet of the base at its bottom end and leveled with the top end of said boat.

10. The apparatus according to claim 9, wherein said outside introducing pipe of the source gas introducing means is held by a holder of said deposition base at its bottom section such that it is not played.

11. The apparatus according to claim 10, wherein said holder comprises:
   a fixing rod fixed to an inner wall of said deposition base;
   a holding pipe fitted over said fixing rod and having a set screw on its side wall; and
   a grip provided on a distal end of said holding pipe and having a pipe holding recess for holding said outside introducing pipe of the source gas introducing means.

12. The apparatus according to claim 1, wherein said closing plate is provided with a deposition preventing ring thereon, said deposition preventing ring comprising:
   a cylindrical body surrounding said boat support of the boat lifting ram; and
   a flange closely contacting with the top surface of said closing plate.

13. The apparatus according to claim 12, wherein said deposition preventing ring further comprises:
   a bottom plate integrally formed with a bottom surface of said cylindrical body such that it is placed on the same plane of said flange, said bottom plate being provided at its center with a ram passing hole for movably receiving said boat lifting ram.

14. The apparatus according to claim 5, wherein said outside quartz tube of the reactor is provided with outside projection means on its bottom section, said projection means of the outside quartz tube being selectively stopped by a slide support of a housing of the apparatus, said slide support being provided in said housing such that it laterally slides.

15. The apparatus according to claim 1, wherein said boat support of the boat lifting ram is provided with a plurality of perforations.

16. The apparatus according to claim 2, wherein said reactor is provided on its inner surface with a vertical groove for recessing said source gas introducing means therein.

17. The apparatus according to claim 3, wherein said reactor is provided on its inner surface with a vertical groove for recessing said source gas introducing means therein.

18. The apparatus according to claim 4, wherein said source gas introducing means comprises:
   a vertical inlet pipe, the bottom of said vertical inlet pipe being leveled with said source gas inlet of the deposition base while the top of said vertical inlet pipe being leveled with the top end of said boat; and
   an introduction pipe for connecting said source gas inlet of the base to said vertical inlet pipe, said introduction pipe comprising a vertical section connected to said vertical inlet pipe and a horizontal section connected to said source gas inlet of the base.

19. The apparatus according to claim 6, wherein said source gas introducing means comprises:
   a vertical inlet pipe, the bottom of said vertical inlet pipe being leveled with said source gas inlet of the deposition base while the top of said vertical inlet pipe being leveled with the top end of said boat; and
   an introduction pipe for connecting said source gas inlet of the base to said vertical inlet pipe, said introduction pipe comprising a vertical section connected to said vertical inlet pipe and a horizontal section connected to said source gas inlet of the base.

20. The apparatus according to claim 4, wherein said source gas inlet of the deposition base comprises inside and outside pipes, and said source gas introducing means comprises inside and outside introducing pipes, said inside introducing pipe being connected to said inside pipe of the gas inlet of the base at its bottom end and leveled with the bottom end of said heating means at its top end, said outside introducing pipe being connected to said outside pipe of the gas inlet of the base at its bottom end and leveled with the top end of said boat.

21. The apparatus according to claim 6, wherein said source gas inlet of the deposition base comprises inside and outside pipes, and said source gas introducing means comprises inside and outside introducing pipes, said inside introducing pipe being connected to said inside pipe of the gas inlet of the base at its bottom end and leveled with the bottom end of said heating means at its top end, said outside introducing pipe being connected to said outside pipe of the gas inlet of the base at its bottom end and leveled with the top end of said boat.

* * * * *

UNITED STATES PATENT AND TRADEMARK OFFICE
CERTIFICATE OF CORRECTION

PATENT NO. : 5,441,570
DATED : AUGUST 15, 1995
INVENTOR(S) : CHUL-JU HWANG

It is certified that error appears in the above-indentified patent and that said Letters Patent is hereby corrected as shown below:

Column 1, line 6, "2. Field of the Invention" should read -- 1. Field of the Invention --;

Column 3, lines 52-53, delete "waste of" and after "much time" insert -- wasted --;

Column 6, line 1, "out them" should read -- them out --;

Column 6, line 21, "such placed" should read -- placed such --;

Column 8, line 9, delete the second occurrence of "of";

Column 8, line 37, after "effects are" insert -- the --;

Column 8, line 38, delete "them of";

Column 8, line 59, after "25 which" delete "is";

Column 11, line 9, after "the base" insert -- 10 --; and

Column 13, line 27, delete "is".

UNITED STATES PATENT AND TRADEMARK OFFICE
CERTIFICATE OF CORRECTION

PATENT NO. : 5,441,570
DATED : AUGUST 15, 1995
INVENTOR(S) : CHUL-JU HWANG

It is certified that error appears in the above-indentified patent and that said Letters Patent is hereby corrected as shown below:

Column 14, line 68, delete "rude" and substitute therefor -- tube --; and

Column 15, line 6, after "claim 1" insert -- , --.

Signed and Sealed this

Twenty-first Day of November, 1995

BRUCE LEHMAN

Attest:

Attesting Officer

Commissioner of Patents and Trademarks